(12) United States Patent
Byrne et al.

(10) Patent No.: US 11,129,269 B2
(45) Date of Patent: *Sep. 21, 2021

(54) VEHICULAR CAMERA WITH FOCUS ATHERMALIZATION

(71) Applicant: Magna Electronics Inc., Auburn Hills, MI (US)

(72) Inventors: Steven V. Byrne, Goodrich, MI (US); Yuesheng Lu, Farmington Hills, MI (US); Rene Dreiocker, Rochester Hills, MI (US); Jonathan D. Conger, Berkley, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 66 days.

This patent is subject to a terminal disclaimer.

(21) Appl. No.: 15/929,462

(22) Filed: May 4, 2020

(65) Prior Publication Data

US 2020/0267827 A1    Aug. 20, 2020

Related U.S. Application Data

(63) Continuation of application No. 16/364,250, filed on Mar. 26, 2019, now Pat. No. 10,645,795.

(60) Provisional application No. 62/711,656, filed on Jul. 30, 2018, provisional application No. 62/649,652, filed on Mar. 29, 2018.

(51) Int. Cl.
*H05K 1/02* (2006.01)
*H04N 5/225* (2006.01)
*G02B 7/02* (2021.01)
*B60R 11/04* (2006.01)
(Continued)

(52) U.S. Cl.
CPC ............ *H05K 1/0203* (2013.01); *B60R 11/04* (2013.01); *G02B 7/028* (2013.01); *H04N 5/2252* (2013.01); *H04N 5/2254* (2013.01); *H04N 5/2257* (2013.01); *B60R 1/00* (2013.01); *B60R 1/12* (2013.01); *B60R 2001/1215* (2013.01); *B60R 2300/105* (2013.01); *H05K 2201/068* (2013.01); *H05K 2201/10121* (2013.01)

(58) Field of Classification Search
USPC ......................................................... 348/148
See application file for complete search history.

(56) References Cited

U.S. PATENT DOCUMENTS 5,550,677 A    8/1996 Schofield et al.
5,670,935 A    9/1997 Schofield et al.
(Continued)

*Primary Examiner* — John W Miller
*Assistant Examiner* — Omer Khalid
(74) *Attorney, Agent, or Firm* — Honigman LLP

(57) ABSTRACT

A camera module for a vehicular vision system includes a lens barrel accommodating a lens, a front camera housing portion having an imager PCB disposed therein, and a rear camera housing portion mated with the front camera housing. The imager PCB is disposed at the front camera housing portion with the imager optically aligned with an optical axis of the optical elements of the lens barrel. A thermal element (i) is disposed between the imager PCB and the front camera housing portion and has a coefficient of thermal expansion (CTE) element of 13 ppm/° C. or less and/or (ii) has its temperature controlled via a thermoelectric device of the camera module. With the camera module disposed at the vehicle, circuitry of the camera module is in electrical connection with a wire harness of the vehicle.

30 Claims, 3 Drawing Sheets

(51) Int. Cl.
   *B60R 1/12* (2006.01)
   *B60R 1/00* (2006.01)

(56) References Cited

U.S. PATENT DOCUMENTS

| | | | |
|---|---|---|---|
| 5,949,331 A | 9/1999 | Schofield et al. | |
| 5,978,017 A * | 11/1999 | Tino | B60Q 1/52 |
| | | | 348/148 |
| 6,151,065 A | 11/2000 | Steed et al. | |
| 7,965,336 B2 | 6/2011 | Bingle et al. | |
| 8,542,451 B2 | 9/2013 | Lu et al. | |
| 8,994,878 B2 | 3/2015 | Byrne et al. | |
| 9,077,098 B2 | 7/2015 | Latunski | |
| 9,277,104 B2 | 3/2016 | Sesti et al. | |
| 9,621,769 B2 | 4/2017 | Mai et al. | |
| 10,207,646 B2 | 2/2019 | Oh | |
| 10,274,812 B1 * | 4/2019 | Chen | H04N 5/2254 |
| 10,645,795 B2 * | 5/2020 | Byrne | B60R 11/04 |
| 2003/0090569 A1 * | 5/2003 | Poechmueller | B60Q 1/302 |
| | | | 348/148 |
| 2009/0244361 A1 | 10/2009 | Gebauer et al. | |
| 2011/0025850 A1 * | 2/2011 | Maekawa | H05K 9/002 |
| | | | 348/148 |
| 2011/0298925 A1 * | 12/2011 | Inoue | G03B 17/55 |
| | | | 348/148 |
| 2013/0242099 A1 | 9/2013 | Sauer et al. | |
| 2014/0373345 A1 | 12/2014 | Steigerwald | |
| 2015/0015713 A1 * | 1/2015 | Wang | H05K 999/99 |
| | | | 348/148 |
| 2015/0029337 A1 * | 1/2015 | Uchiyama | H04N 7/18 |
| | | | 348/148 |
| 2015/0124098 A1 | 5/2015 | Winden et al. | |
| 2015/0222795 A1 | 8/2015 | Sauer et al. | |
| 2015/0327398 A1 * | 11/2015 | Achenbach | B60R 1/00 |
| | | | 348/148 |
| 2016/0037028 A1 | 2/2016 | Biemer | |
| 2016/0191863 A1 * | 6/2016 | Minikey, Jr. | B60R 11/04 |
| | | | 348/148 |
| 2016/0229346 A1 * | 8/2016 | Oh | H04N 5/2253 |
| 2016/0243987 A1 | 8/2016 | Kendall | |
| 2016/0268716 A1 | 9/2016 | Conger et al. | |
| 2016/0286103 A1 | 9/2016 | Van Dan Elzen | |
| 2017/0036600 A1 * | 2/2017 | Whitehead | H04N 5/247 |
| 2017/0054881 A1 | 2/2017 | Conger et al. | |
| 2017/0133811 A1 | 5/2017 | Conger et al. | |
| 2017/0201661 A1 | 7/2017 | Conger | |
| 2017/0280034 A1 | 9/2017 | Hess et al. | |
| 2017/0295306 A1 | 10/2017 | Mleczko | |
| 2017/0302829 A1 | 10/2017 | Mleczko et al. | |
| 2018/0027151 A1 * | 1/2018 | Kazama | H04N 5/2254 |
| | | | 348/373 |
| 2018/0098033 A1 | 4/2018 | Mleczko et al. | |
| 2019/0121051 A1 | 4/2019 | Byrne et al. | |
| 2019/0124238 A1 | 4/2019 | Byrne et al. | |
| 2019/0124243 A1 | 4/2019 | Mleczko et al. | |

* cited by examiner

VEHICULAR CAMERA WITH FOCUS ATHERMALIZATION

CROSS REFERENCE TO RELATED APPLICATIONS

The present application is a continuation of U.S. patent application Ser. No. 16/364,250, filed Mar. 26, 2019, now U.S. Pat. No. 10,645,795, which claims priority of U.S. provisional application Ser. No. 62/711,656, filed Jul. 30, 2018, and U.S. provisional application Ser. No. 62/649,652, filed Mar. 29, 2018, which are hereby incorporated herein by reference in their entireties.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Various cameras have been proposed for such imaging systems, including cameras of the types described in U.S. Pat. No. 7,965,336 and U.S. Publication No. US-2009-0244361, which are hereby incorporated herein by reference in their entireties.

SUMMARY OF THE INVENTION

The present invention provides a vision system or imaging system for a vehicle that utilizes one or more cameras to capture image data representative of images exterior of the vehicle. The camera or camera module comprises an imager and a circuit board (or circuit boards) and a lens at a lens barrel. A front camera housing portion is configured to receive an imager printed circuit board therein, with the imager printed circuit board disposed at the lens barrel with the imager optically aligned with an optical axis of optical elements of the lens. A rear camera housing portion is mated with a rear portion of the front camera housing so as to encase and seal the imager printed circuit board in the camera module. A thermal element disposed between the front camera housing portion and the imager printed circuit board. The thermal element is selected from the group consisting of (i) a thermal element having a coefficient of thermal expansion (CTE) element of less than 10 ppm/° C. and (ii) a thermal element that has its temperature controlled via a thermal electric device of said camera module. Circuitry of the camera module is electrically connected to the imager (and the thermoelectric device if applicable) and is electrically connected to electrical connecting elements that are configured to electrically connect to a wire harness of the vehicle.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
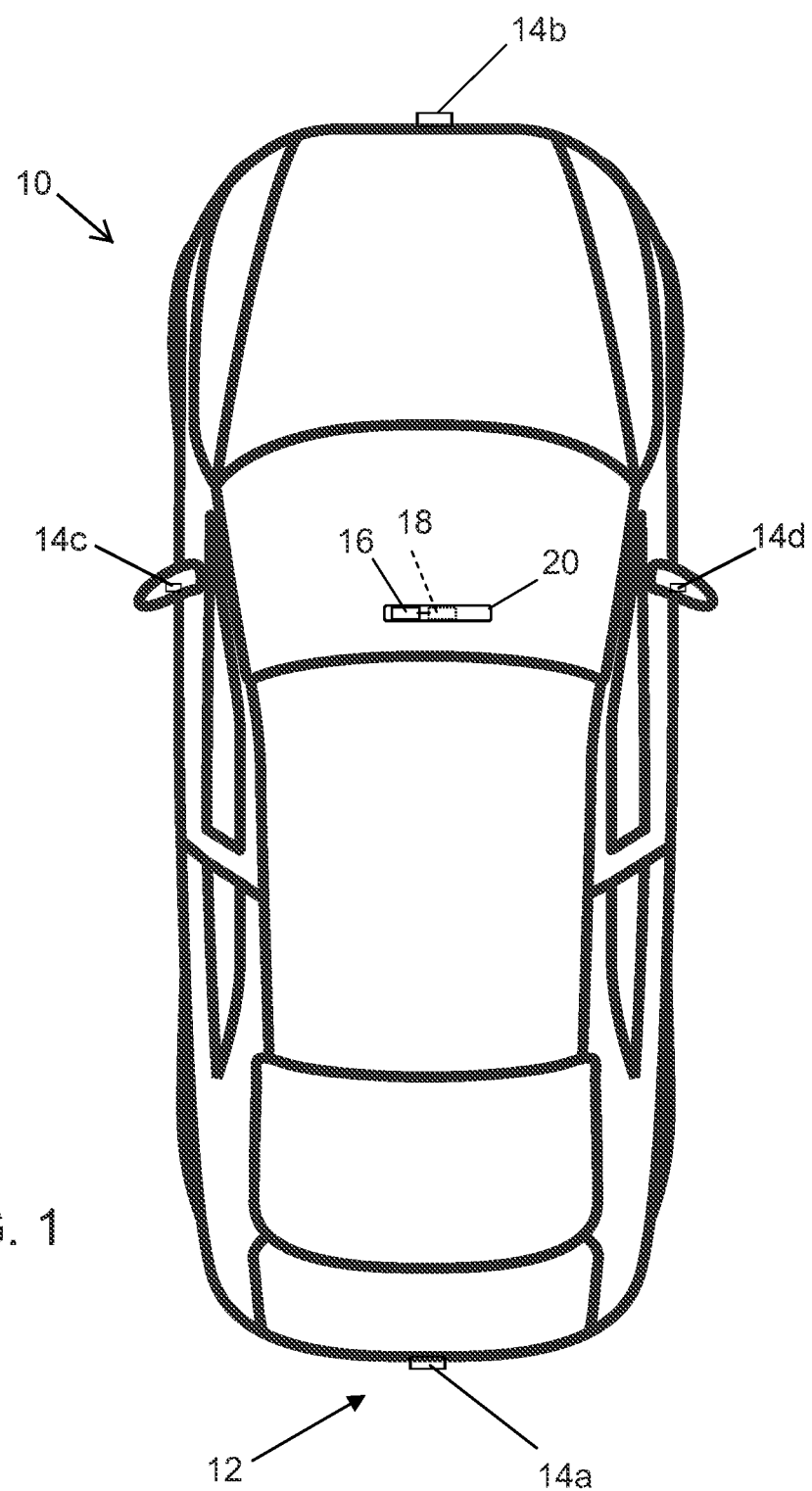
FIG. 1 is a plan view of a vehicle with a vision system that incorporates multiple cameras.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forwardly facing camera 14b at the front (or at the windshield) of the vehicle, and a sideward/rearward facing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or processor 18 that is operable to process image data captured by the camera or cameras and may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

The control unit may comprise or may be part of an autonomous vehicle control system, whereby the cameras capture image data that is processed for use in autonomously controlling the vehicle. Autonomous vehicle cameras may require very high levels of focus precision in all environments. This means the lens-to-image sensor distance must be stable. The coefficient of thermal expansion for standard materials such as aluminum, zinc and magnesium may be too high for the required range of temperatures for automotive cameras.

Figure 2:
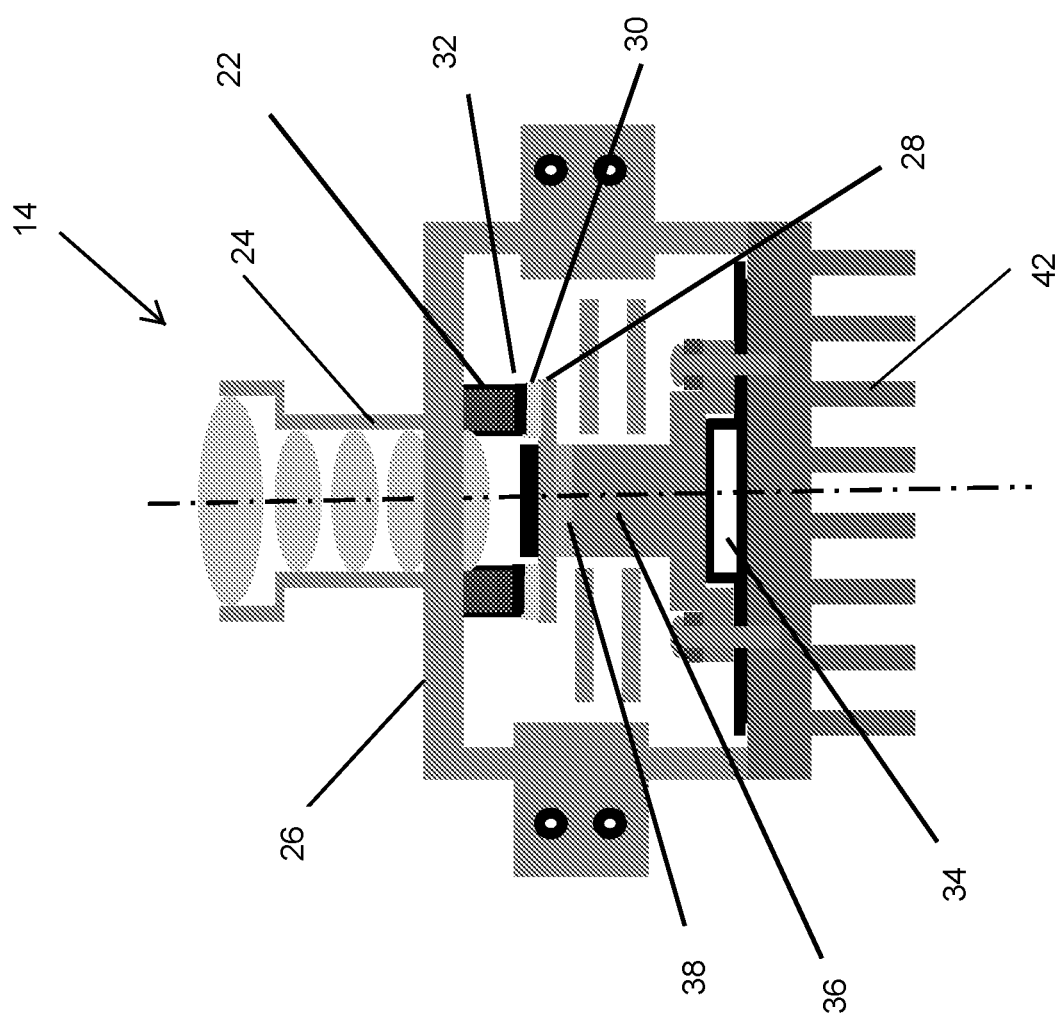
FIG. 2 is a sectional view of a camera module in accordance with the present invention.

As shown in FIG. 2, the camera module of the present invention includes a lens barrel and camera upper or front housing portion, with the imager disposed at or near the lens barrel and focused and aligned with the optical elements of the lens barrel.

The camera module 14 includes a thermal element 22 comprising a very low coefficient of thermal expansion (CTE) material between the lens (or lens holder) and the imager (or imager circuit board). As shown in FIG. 2, the low CTE athermalization material (such as, for example, Invar or other suitable material) is disposed at the lens holder 24 of the front camera housing portion 26 and between the lens holder and the imager circuit board or imager PCB 28. The thermal element or low CTE material 22 attaches the imager PCB to the lens barrel system and secures or attaches the imager PCB relative to the lens barrel system after alignment and focusing of the lens and imager. A pliable quick-cure adhesive 30 may be disposed at the imager circuit board, and an intermediary material 32 between the adhesive and the low CTE component may be provided for bonding purposes.

The CTE of the material should at least less than about 13 ppm/° C. as is common for many metals such as steel and titanium. This range can also be achieved with some glass filled plastics such as Polyamide-imide (PAI), Polyetherimide (PEI) and PolyEtherEtherKetone (PEEK). However, a material having a CTE of less than about 10 ppm/° C. is preferred, and preferably a material having a CTE less than about 7 ppm/° C. or less than about 5 ppm/° C. For example, a material with a CTE property of less than about 2 ppm/° C. is preferred. An example of such a material is Invar, generically known as FeNi36 or 64FeNi, or a variant of Invar, such as Inovco or Kovar.

Adhesion to this very low CTE material may be promoted by way of surface treatments or a secondary thin intermediary material such as epoxy. The intermediary material is selected to bond well to the low CTE component and to reside between the CTE component and the unique and known adhesives necessary for camera production.

Optionally, the low CTE material/component and/or the intermediary material/component may be a component only directly between the lens and imager or may be expanded to serve as a larger portion of the camera structure. For example, the entire front of the camera, including the lens barrel, could be formed from this low CTE material. Optionally, the athermalization material/component and/or the intermediary material/component may comprise a suitable higher CTE material that may be selected to actively control the focus, depending on the particular camera application, including the particular camera structure and lens behavior. In such an application, the higher CTE materials may have a CTE of around 30 ppm/° C. or more, such as up to or greater than around 50 ppm/° C. or more, or even up to or greater than around 100 ppm/° C., depending on the particular application and desired function of the material/component.

The high precision autonomous vehicle camera may have internal temperature control for image sensor performance reasons. This same architecture can be expanded to include temperature control of the lens-to-imager structure.

Figure 3:
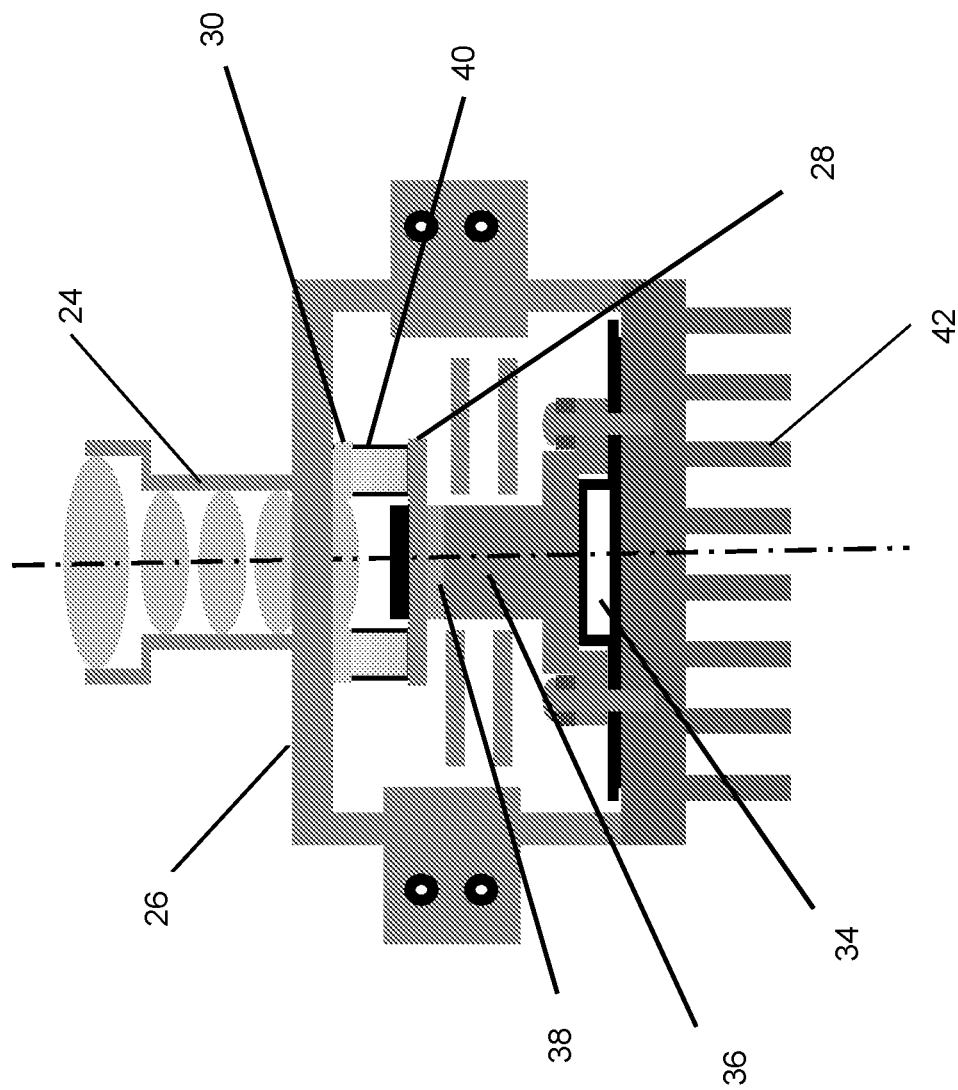
FIG. 3 is a sectional view of another camera module in accordance with the present invention.

Optionally, for example, the autonomous vehicle camera may include active cooling. As shown in FIGS. 2 and 3, the rear housing portion of the camera 14 may include an electrically powered thermoelectric cooler (TEC) 34 that is in contact with a heat transfer element or cold finger 36 that extends from the TEC to the imager circuit board 28. The TEC is used to substantially cool the image sensor to a desired temperature. The camera includes temperature sensors within the camera that are used to control power to the TEC as needed for cooling effect. For example, responsive to the sensed temperature being above a threshold level, power to the TEC may be provided or increased or modulated or controlled to provide more cooling. The system may continuously or episodically sense or monitor the camera temperature and may continuously or episodically adjust the power supplied to the TEC to provide the desired cooling effect. The sensor and control for sensing temperature and controlling or powering the TEC may be part of the camera module itself, such as part of the circuitry disposed on one or more circuit boards in the camera module.

Optionally, the camera may include features to control the temperature of the lens-to-imager material or component, such that the CTE properties may not be as critical (due to the reduction in temperature variation of the lens-to-imager material or component). For example, and such as shown in FIG. 3, the thermal element may comprise or include a thermal electric cooler 34 used to limit the imager temperature in hot environments may also be used to control the temperature of internal materials that hold lens-to-imager distance. For example, a thermal electric cooler (or additional thermal electric cooler or TEC) may be added to control the temperature of the internal materials that hold the lens-to-imager distance.

In the illustrated embodiment, the camera includes lens-to-imager posts 40 that may be surface mounted to the imager PCB 28 so as to provide enhanced thermal conduction to cooling components. A compliant or pliable quick-cure adhesive 30 is disposed between the posts and the camera housing 26 or lens holder 24 and may also serve as a thermal insulator between the temperature controlled lens-to-imager material or posts and the camera housing or lens holder. The lens-to-imager structure can be made out of materials currently suitable for adhesives and soldering processes, such as, for example, aluminum or nickel plated steel or the like.

Optionally, and as also shown in FIGS. 2 and 3, the rear cover of the camera will be used as a "heat sink" and can have cooling fins or pins 42. The TEC is disposed or captured between the rear cover or rear housing portion and a copper or aluminum "cold finger" or element that directs or transfers the heat from the image sensor to the TEC. Optionally, a thermal element or thermal interface material 38 may be disposed between the imager circuit board and the heat transfer element to enhance heat transfer from the rear of the imager circuit board to the heat transfer element.

In the illustrated embodiment, the camera module includes two printed circuit boards (in addition to the imager PCB) that include circuitry associated with the imager and camera. The heat transfer element protrudes generally centrally aligned holes or apertures in the two PCBs and terminates at the rear of the imager PCB, such that the heat transfer element thermally conductively connects at the rear of the imager PCB to draw or conduct or transfer heat generated by the imager (during operation of the camera) away from the imager PCB to the TEC and rear cover or housing portion. Optionally, the heat transfer element may contact one or both of the other PCBs to draw heat from them as well. Circuitry of the PCBs and of the camera module (including the TEC or circuitry associated with the TEC) is electrically connected to the imager and is electrically connected to electrical connecting elements that are configured to electrically connect to a wire harness of the vehicle. Optionally, the camera may only comprise a single PCB, which has the imager disposed at one side (facing the lens) and circuitry and thermal interface material disposed at the other side (facing the TEC and rear of the camera housing). The circuitry (which may be disposed at both sides of the single PCB (or multiple PCBs) may include electrical connector elements for electrically connecting to the wire harness of the vehicle when the camera is installed at the vehicle.

The thermal electric cooler or TEC may be operable to heat or cool selected components of the camera to take into account temperature changes and effects on various camera components. Optionally, the TEC may be actively controlled to change the focus of the camera regardless of temperature variations and component expansion or contraction due to extreme temperature changes. For example, the TEC may heat or cool the lens-to-imager posts to change the gap between the lens and the imager and thus to change the focus of the lens at the imager, or the TEC may heat or cool the heat transfer element or cold finger to cause expansion or contraction of that element to move the imager relative to the lens to change the gap between the lens and the imager and thus to change the focus of the lens at the imager.

The TEC thus provides an active focus or controllable focusing device, which may be operable to adjust the focus of the camera responsive to, for example, processing of image data captured by the camera (to bring the images into sharper focus or to adjust focus to enhance focusing of particular elements present in the field of view of the camera or to provide closer focus or more distant focus depending on the particular application or situation). For example, for a backup camera and during a reversing maneuver of the vehicle, the system may adjust focusing of the camera to closer objects responsive to detection of an object or potential hazard immediately rearward of the vehicle, but may adjust focusing of the camera to further objects or distances when no such objects or potential hazards are detected (to provide a clearer video display of the region rearward of the vehicle for the driver to view during the reversing maneuver). Optionally, the TEC may provide such an active focus feature responsive to a user input or responsive to temperature sensors or the like at the camera. Optionally, the TEC may function to heat or cool other components of the camera that (when heated/expanded or cooled/contracted) may affect the relative position of the lens and imager and thus may affect the focus of the camera.

Optionally, the coefficient of thermal expansion (CTE) of various components may be selected such that the element (s) that the TEC heats/cools may expand/contract more or less than other components to achieve the desired lens-to-imager adjustment (such as by utilizing aspects of the cameras described in U.S. provisional applications, Ser. No. 62/696,502, filed Jul. 11, 2018, and Ser. No. 62/690,527, filed Jun. 27, 2018, which are hereby incorporated herein by reference in their entireties). For example, materials with higher or lower CTEs may be selected to expand/contract more or less when the TEC heats/cools, whereby the components work together to adjust the focus of the camera.

The camera module may utilize aspects of the cameras and connectors described in U.S. Pat. Nos. 9,621,769; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0054881; US-2017-0133811; US-2017-0201661; US-2017-0280034; US-2017-0295306; US-2017-0302829 and/or US-2018-0098033, and/or U.S. patent application Ser. No. 16/165,170, filed Oct. 19, 2018, and published on Apr. 25, 2019 as U.S. Publication No. US-2019-0124238, Ser. No. 16/165,204, filed Oct. 19, 2018, and published Apr. 25, 2019 as U.S. Publication No. US-2019-0124243, and/or Ser. No. 16/165,253, filed Oct. 19, 2018, and published Apr. 25, 2019 as U.S. Publication No. US-2019-0121051, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/

081985, and/or U.S. Pat. No. 9,126,525, which are hereby incorporated herein by reference in their entireties.

The system may utilize sensors, such as radar or lidar sensors or the like. The sensing system may utilize aspects of the systems described in U.S. Pat. Nos. 9,753,121; 9,689,967; 9,599,702; 9,575,160; 9,146,898; 9,036,026; 8,027,029; 8,013,780; 6,825,455; 7,053,357; 7,408,627; 7,405,812; 7,379,163; 7,379,100; 7,375,803; 7,352,454; 7,340,077; 7,321,111; 7,310,431; 7,283,213; 7,212,663; 7,203,356; 7,176,438; 7,157,685; 6,919,549; 6,906,793; 6,876,775; 6,710,770; 6,690,354; 6,678,039; 6,674,895 and/or 6,587,186, and/or International Publication Nos. WO 2018/007995 and/or WO 2011/090484, and/or U.S. Publication Nos. US-2018-0231635; US-2018-0045812; US-2018-0015875; US-2017-0356994; US-2017-0315231; US-2017-0276788; US-2017-0254873; US-2017-0222311 and/or US-2010-0245066, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A camera module for a vehicular vision system, said camera module comprising:
   a lens barrel accommodating a lens comprising a plurality of optical elements;
   a front camera housing portion having an imager printed circuit board disposed therein, wherein an imager is disposed at a side of said imager printed circuit board, and wherein said imager comprises a CMOS photosensor array;
   wherein said imager printed circuit board is disposed in said front camera housing portion with said imager optically aligned with an optical axis of said optical elements of said lens barrel;
   a rear camera housing portion mated with said front camera housing portion so as to encase said imager printed circuit board in said camera module;
   a thermal element disposed at said imager printed circuit board;
   wherein at least one selected from the group consisting of (i) said thermal element is disposed between said imager printed circuit board and said front camera housing portion and has a coefficient of thermal expansion (CTE) of 13 ppm/° C. or less and (ii) said thermal element has its temperature controlled via a thermoelectric device of said camera module; and
   wherein, with said camera module disposed at a vehicle equipped with said camera module, circuitry of said camera module is in electrical connection with a wire harness of the equipped vehicle.

2. The camera module of claim 1, wherein said thermal element is disposed between said imager printed circuit board and said front camera housing portion and has a CTE of 13 ppm/° C. or less.

3. The camera module of claim 2, wherein said thermal element has a CTE of 10 ppm/° C. or less.

4. The camera module of claim 2, wherein said thermal element has a CTE of 7 ppm/° C. or less.

5. The camera module of claim 2, wherein said thermal element has a CTE of 5 ppm/° C. or less.

6. The camera module of claim 1, wherein said thermal element has its temperature controlled via a thermoelectric device of said camera module.

7. The camera module of claim 6, wherein said thermal element is disposed at a side of said imager printed circuit board that is opposite the side of said imager printed circuit board at which said imager is disposed.

8. The camera module of claim 6, wherein said thermoelectric device is electrically powered to draw heat from said thermal element.

9. The camera module of claim 8, comprising a temperature sensor disposed in said camera module, wherein said thermoelectric device operates responsive to an output of said temperature sensor.

10. The camera module of claim 9, wherein said thermoelectric device operates responsive to the output of said temperature sensor being indicative of a camera temperature being above or below a threshold temperature.

11. The camera module of claim 6, wherein said thermoelectric device changes the temperature of at least said thermal element to adjust focusing of images by said lens at said imager.

12. The camera module of claim 1, wherein the circuitry in electrical connection with the wire harness of the equipped vehicle comprises circuitry of said imager printed circuit board.

13. The camera module of claim 1, wherein said rear camera housing portion comprises a heat sink.

14. The camera module of claim 1, wherein said camera module is configured to be disposed at an in-cabin side of a windshield of the equipped vehicle, and wherein, with said camera module disposed at the in-cabin side of the windshield of the equipped vehicle, said camera module views forward through the windshield.

15. The camera module of claim 1, wherein said camera module is configured to be disposed at an exterior portion of the equipped vehicle, and wherein, with said camera module disposed at the exterior portion of the equipped vehicle, said camera module views exterior of equipped vehicle.

16. A camera module for a vehicular vision system, said camera module comprising:
   a lens barrel accommodating a lens comprising a plurality of optical elements;
   a front camera housing portion having an imager printed circuit board disposed therein, wherein an imager is disposed at a side of said imager printed circuit board, and wherein said imager comprises a CMOS photosensor array;
   wherein said imager printed circuit board is disposed in said front camera housing portion with said imager optically aligned with an optical axis of said optical elements of said lens barrel;
   a rear camera housing portion mated with said front camera housing portion so as to encase said imager printed circuit board in said camera module;
   a thermal element disposed at said imager printed circuit board;
   wherein said thermal element is disposed between said imager printed circuit board and said front camera housing portion and has a coefficient of thermal expansion (CTE) of 13 ppm/° C. or less;
   wherein said camera module is configured to be disposed at an in-cabin side of a windshield of a vehicle equipped with said camera module, and wherein, with said camera module disposed at the in-cabin side of the windshield of the equipped vehicle, said camera module view forward through the windshield; and
   wherein, with said camera module disposed at the in-cabin side of the windshield of the equipped vehicle, circuitry of said camera module is in electrical connection with a wire harness of the equipped vehicle.

17. The camera module of claim 16, wherein said thermal element has a CTE of 10 ppm/° C. or less.

18. The camera module of claim 16, wherein said thermal element has a CTE of 7 ppm/° C. or less.

19. The camera module of claim 16, wherein said thermal element has a CTE of 5 ppm/° C. or less.

20. The camera module of claim 16, wherein said rear camera housing portion comprises a heat sink.

21. The camera module of claim 16, wherein said thermal element is bonded at said imager printed circuit board via an adhesive.

22. The camera module of claim 21, comprising an intermediary material disposed between the adhesive and said thermal element.

23. A camera module for a vehicular vision system, said camera module comprising:
   a lens barrel accommodating a lens comprising a plurality of optical elements;
   a front camera housing portion having an imager printed circuit board disposed therein, wherein an imager is disposed at a side of said imager printed circuit board, and wherein said imager comprises a CMOS photosensor array;
   wherein said imager printed circuit board is disposed in said front camera housing portion with said imager optically aligned with an optical axis of said optical elements of said lens barrel;
   a rear camera housing portion mated with said front camera housing portion so as to encase said imager printed circuit board in said camera module;
   a thermal element disposed at said imager printed circuit board;
   wherein said thermal element has its temperature controlled via a thermoelectric device of said camera module;
   wherein said camera module is configured to be disposed at an in-cabin side of a windshield of a vehicle equipped with said camera module, and wherein, with said camera module disposed at the in-cabin side of the windshield of the equipped vehicle, said camera module views forward through the windshield; and
   wherein, with said camera module disposed at the in-cabin side of the windshield of the equipped vehicle, circuitry of said camera module is in electrical connection with a wire harness of the equipped vehicle.

24. The camera module of claim 23, wherein said thermal element is disposed at a side of said imager printed circuit board that is opposite the side of said imager printed circuit board at which said imager is disposed.

25. The camera module of claim 23, wherein said thermoelectric device is electrically powered to draw heat from said thermal element.

26. The camera module of claim 25, comprising a temperature sensor disposed in said camera module, wherein said thermoelectric device operates responsive to an output of said temperature sensor.

27. The camera module of claim 26, wherein said thermoelectric device operates responsive to the output of said temperature sensor being indicative of a camera temperature being above or below a threshold temperature.

28. The camera module of claim 23, wherein said thermoelectric device changes the temperature of at least said thermal element to adjust focusing of images by said lens at said imager.

29. The camera module of claim 23, wherein said rear camera housing portion comprises a heat sink.

30. The camera module of claim 29, wherein said thermal element is in thermally conductive contact with said rear camera housing portion at said heat sink.

* * * * *